(12) United States Patent
Kaneko et al.

(10) Patent No.: US 6,546,614 B2
(45) Date of Patent: Apr. 15, 2003

(54) METHOD OF PREPARING OXIDE SUPERCONDUCTING WIRE

(75) Inventors: Tetsuyuki Kaneko, Osaka (JP); Naoki Ayai, Osaka (JP); Jun Fujikami, Osaka (JP); Shinichi Kobayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/920,947

(22) Filed: Aug. 3, 2001

(65) Prior Publication Data
US 2002/0043298 A1 Apr. 18, 2002

(30) Foreign Application Priority Data
Aug. 29, 2000 (JP) ........................................ 2000-258841

(51) Int. Cl.[7] .............................................. H01L 39/24
(52) U.S. Cl. ...................... 29/599; 505/430; 505/492; 505/501
(58) Field of Search ..................... 29/599; 505/430, 505/492, 501

(56) References Cited

U.S. PATENT DOCUMENTS 4,223,434 A * 9/1980 Wang et al. ................. 29/599
4,965,245 A * 10/1990 Sugimoto et al. ............. 29/599
5,541,154 A   7/1996 Neubacher et al. ......... 505/450
5,898,020 A * 4/1999 Goyal et al. ................. 29/599
6,136,756 A * 10/2000 Langbein et al. ............. 29/599

FOREIGN PATENT DOCUMENTS

| JP | 6-72713 | 3/1994 |
| JP | 6-176637 | 6/1994 |
| JP | 7-2525 | 1/1995 |
| JP | 7-300314 | 11/1995 |

* cited by examiner

Primary Examiner—David P. Bryant
(74) Attorney, Agent, or Firm—Foley & Lardner (57) ABSTRACT

The diameter of a first metal tube charged with raw material powder is reduced for obtaining an elementary wire. A plurality of such elementary wires are charged into a second metal tube, which in turn is reduced in diameter for obtaining a round first wire having a plurality of first filaments. The first wire is uniaxially compressed thereby obtaining a tape-like second wire having a plurality of second filaments. The second wire is heat treated thereby obtaining an oxide superconducting wire including a plurality of superconductor filaments. The maximum grain size of the raw material powder is smaller than the minor diameter of the first or second filaments.

24 Claims, 5 Drawing Sheets

METHOD OF PREPARING OXIDE SUPERCONDUCTING WIRE

BACKGROUND OF THE INVENTION

1. Field of the Invention

The present invention relates to a method of preparing an oxide superconducting wire, and more particularly, it relates to a method of preparing an oxide superconducting wire of a multi-filamentary structure comprising a step of charging raw material powder for an oxide superconductor into a metal tube.

2. Description of the Background Art

In general, it is known that the following steps are employed for preparing an oxide superconducting wire of a multi-filamentary structure by coating an oxide superconductor containing copper with a metal:

(i) charging raw material powder for an oxide or the like into a metal tube consisting of silver or the like and thereafter drawing the metal tube thereby preparing a single-filamentary material;

(ii) bundling a plurality of such single-filamentary materials and charging the bundle into another metal tube for forming a base material of a multi-filamentary structure; and (iii) performing drawing, rolling and the like on the base material of the multi-filamentary structure for forming a wire and thereafter heat treating the wire for sintering the raw material powder thereby obtaining an oxide superconducting wire.

In such a method of preparing an oxide superconducting wire, factors of the raw material powder charged into the metal tube and the performance (critical current) of the oxide superconducting wire are strongly correlated with each other. In particular, the types and the ratios of the elements forming the raw material powder consisting of CaO and CuO or having the structure of $CaCuO_2$, for example, the sizes (grain sizes) of the grains forming the powder and the like can be exemplified as the factors of the raw material powder.

Some reports have been made on studies noting the sizes of the grains forming the raw material powder among these factors. While the factor of the sizes of the grains forming the raw material powder is grasped in view of the mean grain size in these reports, no consideration is made on the correlation between the sizes of the grains forming the raw material powder and the shape of the wire (for example, the size of superconductor filaments included in the wire). In general, therefore, it is difficult to maximally bring out the performance of the oxide superconducting wire.

SUMMARY OF THE INVENTION

An object of the present invention is to clarify the relation between the sizes of grains forming raw material powder charged into a metal tube and the size of superconductor filaments included in a wire and provide a method of preparing an oxide superconducting wire capable of maximally improving the critical current of the oxide superconducting wire on the basis of the relation.

The inventor has made various studies on the relation between the sizes of grains forming raw material powder charged into a metal tube and the size of superconductor filaments included in a wire, to find out that it is necessary to select the optimum grain size of the raw material powder charged into the metal tube not with reference to the mean grain size but with reference to the maximum grain size while adjusting the selected optimum maximum grain size in response to the diameter of the superconductor filaments included in the prepared wire, in order to increase the critical current of the oxide superconducting wire. The present invention has been proposed on the basis of the aforementioned recognition of the inventor.

A method of preparing an oxide superconducting wire according to an aspect of the present invention comprises the following steps (a) to (g) and feature (h):

(a) preparing raw material powder for an oxide superconductor;

(b) charging the raw material powder into a first metal tube;

(c) reducing the diameter of the first metal tube charged with the raw material powder thereby obtaining an elementary wire;

(d) charging a plurality of such elementary wires into a second metal tube;

(e) reducing the diameter of the second metal tube charged with the elementary wires thereby obtaining a first wire, isotropically shaped in cross section, having a plurality of first filaments each containing the raw material powder;

(f) performing uniaxial compression on the first wire thereby obtaining a tape-like second wire having a plurality of second filaments each containing the raw material powder; and (g) performing heat treatment on the second wire thereby obtaining an oxide superconducting wire including a plurality of superconductor filaments, and (h) the maximum grain size of the raw material powder is smaller than the minor diameter of the first filaments.

In the aforementioned method of preparing an oxide superconducting wire, the maximum grain size of the raw material powder is preferably smaller than the minor diameter of the second filaments.

The aforementioned method of preparing an oxide superconducting wire preferably further comprises a step of performing uniaxial compression on the second wire subjected to the heat treatment and thereafter performing heat treatment.

A method of preparing an oxide superconducting wire according to another aspect of the present invention comprises the following steps (i) to (q) and feature (r):

(i) preparing raw material powder for an oxide superconductor;

(j) charging the raw material powder into a first metal tube;

(k) reducing the diameter of the first metal tube charged with the raw material powder thereby obtaining an elementary wire;

(l) charging a plurality of such elementary wires into a second metal tube;

(m) reducing the diameter of the second metal tube charged with the elementary wires thereby obtaining a first wire, isotropically shaped in cross section, having a plurality of first filaments each containing the raw material powder;

(n) charging a plurality of such first wires into a third metal tube;

(o) reducing the diameter of the third metal wire charged with the first wires thereby obtaining a second wire, isotropically shaped in cross section, having a plurality of second filaments each containing the raw material powder;

(p) performing uniaxial compression on the second wire thereby obtaining a tape-like third wire having a plurality of third filaments each containing the raw material powder; and (q) performing heat treatment on the third wire thereby obtaining an oxide superconducting wire including a plurality of superconductor filaments, and (r) the maximum grain size of the raw material powder is smaller than the minor diameter of the second filaments.

In the aforementioned method of preparing an oxide superconducting wire, the maximum grain size of the raw material powder is preferably smaller than the minor diameter of the third filaments.

The aforementioned method of preparing an oxide superconducting wire preferably further comprises a step of performing uniaxial compression on the third wire subjected to the heat treatment and thereafter performing heat treatment.

In the aforementioned method of preparing an oxide superconducting wire according to this aspect, the uniaxial compression is preferably rolling.

A method of preparing an oxide superconducting wire according to still another aspect of the present invention comprises the following steps (s) to (x) and feature (y):

(s) preparing raw material powder for an oxide superconductor;

(t) charging the raw material powder into a first metal tube;

(u) reducing the diameter of the first metal tube charged with the raw material powder thereby obtaining an elementary wire;

(v) charging a plurality of such elementary wires into a second metal tube;

(w) performing plastic working on the second metal tube charged with the elementary wires thereby obtaining a tape-like wire having a plurality of raw material filaments each containing the raw material powder; and (x) heat treating the tape-like wire thereby obtaining an oxide superconducting wire including a plurality of superconductor filaments, and (y) the maximum grain size of the raw material powder is smaller than the minor diameter of the raw material filaments.

In the method of preparing an oxide superconducting wire according to this aspect, the oxide superconductor is preferably a bismuth-based oxide superconductor. The bismuth-based oxide superconductor is preferably a Bi—Pb—Sr—Ca—Cu—O based oxide superconductor.

In this case, the step of preparing the raw material powder for the oxide superconductor preferably prepares raw material powder including a non-superconducting phase and a superconducting phase containing (Bi, Pb), Sr, Ca and Cu in composition ratios of about 2:2:1:2. Each superconductor filament included in the oxide superconducting wire preferably includes a superconducting phase containing (Bi, Pb), Sr, Ca and Cu in composition ratios of about 2:2:2:3.

In the method of preparing an oxide superconducting wire according to this aspect, the metal tube charged with the raw material powder preferably consists of silver or a silver alloy.

According to the present invention, as hereinabove described, the critical current of the oxide superconducting wire can be maximally increased by preparing the raw material powder so that the maximum grain size of the raw material powder charged into the metal tube is smaller than the diameter of the superconducting filaments included in the prepared wire.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
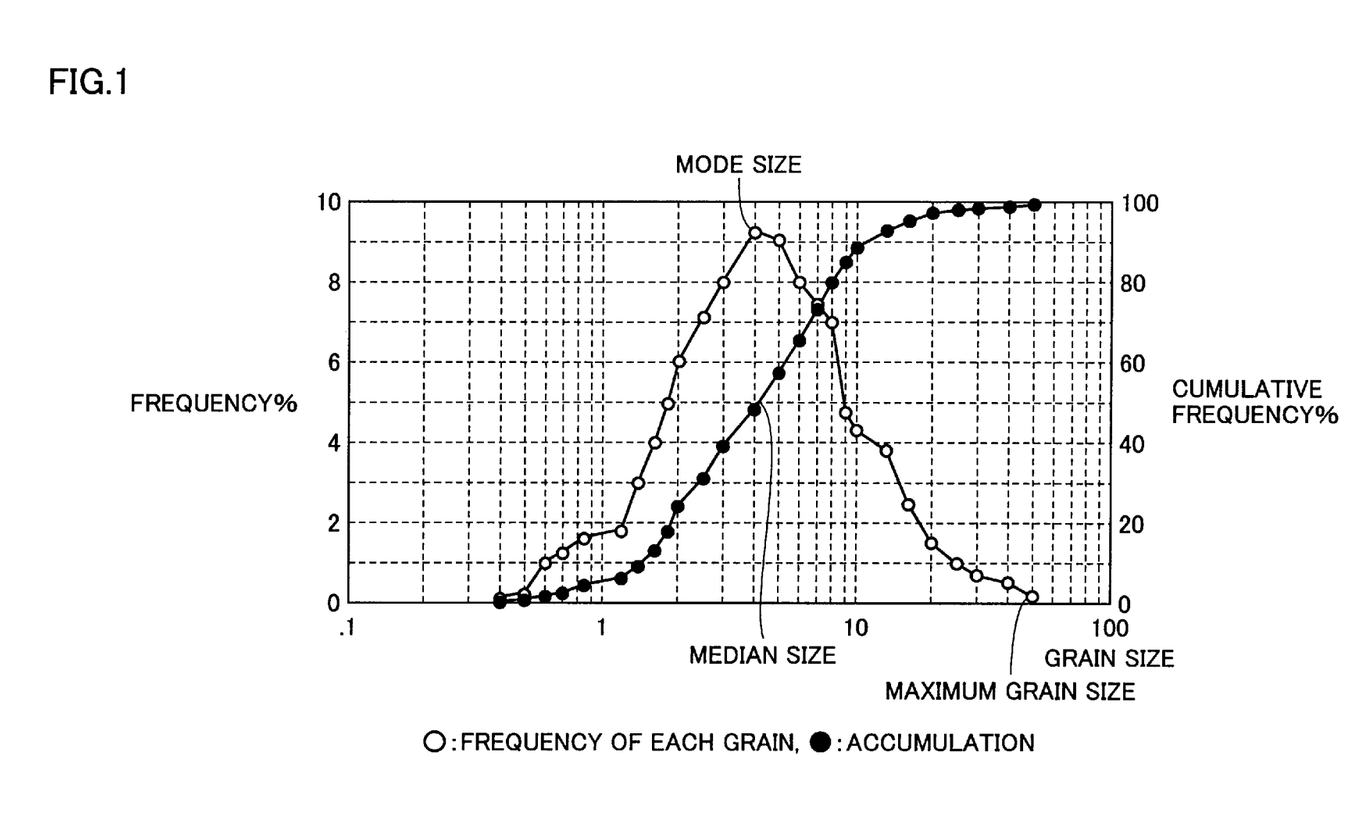
FIG. 1 illustrates grain size distribution of typical powder employed as raw material powder for a metal-coated oxide superconducting wire.

FIG. 1 shows grain size distribution of typical powder employed as raw material for a metal-coated oxide superconducting wire having a $(BiPb)_2Sr_2Ca_2Cu_3O_z$ superconducting phase (a superconducting phase having a critical current of about 110 K; hereinafter referred to as a 2223 phase) as the target superconducting phase. This raw material powder is obtained by mixing carbonates or oxides of bismuth (Bi), lead (Pb), strontium (Sr), calcium (Ca) and copper (Cu) in blending ratios of 1.8:0.3:1.9:2.0:3.0 and thereafter repeatedly performing heat treatment and pulverization on the mixture a plurality of times. From this distribution, a median size or a mode size is generally employed as the mean grain size. This powder is formed by a $(BiPb)_2Sr_2Ca_1Cu_2O_z$ superconducting phase (a superconducting phase having a critical current of about 80 K; hereinafter referred to as a 2212 phase) and a plurality of phases or substances such as $Ca_2PbO_4$, alkaline earth element-copper-oxide (Ca—Cu—O) and the like which are non-superconducting phases.

As understood from FIG. 1, the mean grain size expressed in the median size or the mode size is about 4 $\mu$m, while the sizes of the grains forming the powder are distributed over a wide range of about 0.5 $\mu$m to 50 $\mu$m. While the range of the mean grain size and distribution of the grain sizes of the raw material powder can be shifted to a larger or smaller size by powder preparation means, it is extremely difficult to narrow the distribution range of the grain sizes itself. Although the raw material powder may be sieved for removing only larger grains (classification), the types of the removed grains are not homogeneous but the composition of the raw material powder may deviate from the target composition in this case. Even if the mean grain size of the raw material powder can be reduced, therefore, grains having sizes of about 5 to 10 times the mean grain size inevitably remain in the raw material powder. The presence of such large grains influences the critical current of the prepared oxide superconducting wire.

(Phenomenon 1)

Figure 2:
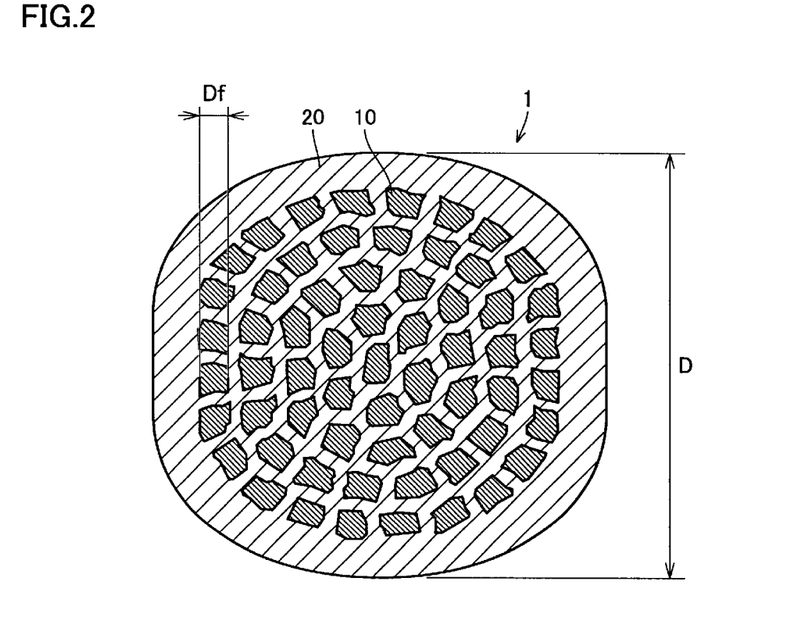
FIG. 2 schematically shows a section of a wire having an isotropic (round) cross-sectional shape reduced in diameter by drawing as an intermediate product for an oxide superconducting wire.

FIG. 2 schematically shows a section of a wire 1 having an isotropic (round) cross-sectional shape reduced in diameter by drawing as an intermediate product for an oxide superconducting wire. As shown in FIG. 2, the round wire 1 is formed by a number of filaments 10 and a metal sheath 20 coating these filaments 10. In general, this wire 1 is rolled into a tape-like shape and thereafter heat treated for providing an oxide superconducting wire of a final shape.

As shown in FIG. 2, the outer diameter D of the wire 1 is about 1.0 mm, for example, and the diameter Df of each filament 10 is about 50 $\mu$m regardless of the minor diameter and the major diameter when the number (filament number) of the filaments 10 is 61. When the powder having the grain size distribution (maximum grain size: about 50 $\mu$m) shown in FIG. 1 is employed as the raw material powder for the filaments 10 forming the wire 1 designed in the aforementioned manner, the critical current of the finally obtained wire cannot be maximally increased.

Figure 3:
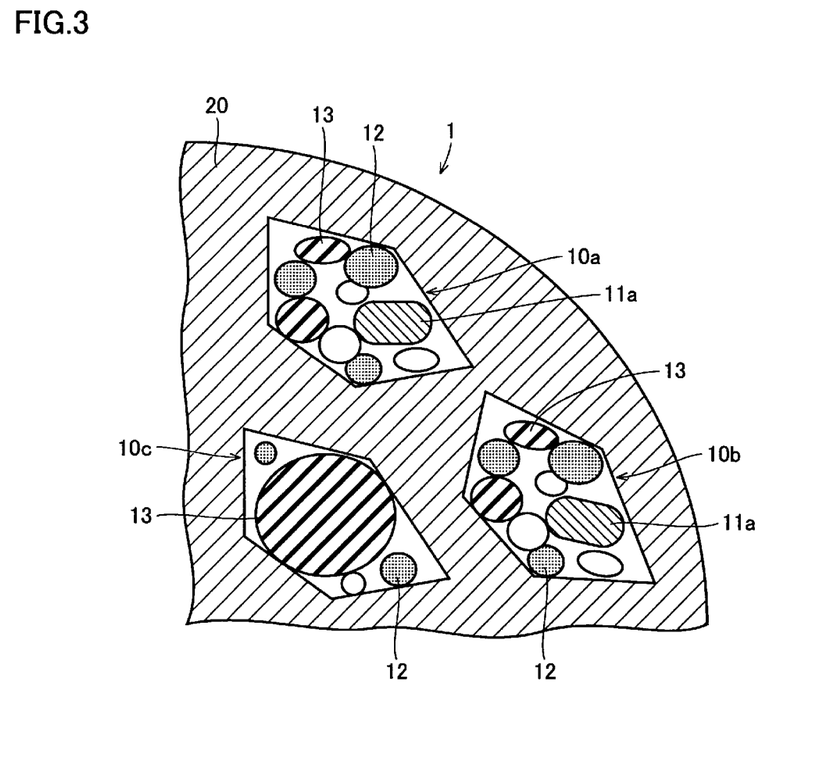
FIG. 3 is a partially fragmented sectional view of the wire schematically showing internal states of filaments.

FIG. 3 is a partially fragmented sectional view of the wire 1 schematically showing a state causable when the powder having the maximum grain size of about 50 $\mu$m is employed for the wire 1 formed by the filaments 10 having the diameter Df of about 50 $\mu$m shown in FIG. 2. As shown in FIG. 3, filaments 10a, 10b and 10c are coated with the metal sheath 20 in the wire 1. As shown in the filaments 10a and 10b, many filaments are homogeneously filled with grains smaller than the diameter Df of the filaments 10. For example, the filaments 10a and 10b are homogeneously filled with grains such as grains 11a of a 2221 phase, grains 12 of a Ca—Cu—O phase and grains 13 of a $Ca_2PbO_4$ phase smaller than the diameter Df of the filaments 10. As shown in the filament 10c, on the other hand, some filaments are clogged with large grains. For example, a grain 13 of the $Ca_2PbO_4$ phase equivalent in size to the diameter Df of the filaments 10 occupies the filament 10c.

When an oxide superconducting wire mainly composed of a 2223 superconducting phase is prepared, a $(BiPb)_2Sr_2Ca_1Cu_2O_z$ superconducting phase (2212 phase) forming raw material powder and a plurality of phases or substances such as $Ca_2PbO_4$, alkaline earth element-copper-oxide (Ca—Cu—O) and the like which are non-superconducting phases react with each other by heat treatment, to obtain a $(BiPb)_2Sr_2Ca_2Cu_3O_z$ superconducting phase (2223 phase).

If grains having sizes substantially same as or larger than the diameter of the filaments remain in the wire obtained as an intermediate product as shown in FIG. 3, the large grains come into contact with other types of grains only in small areas and insufficiently react with these grains upon heat treatment, to remain in the wire of the final shape as such. If the remaining grains are $Ca_2PbO_4$, alkaline earth element-copper-oxide (Ca—Cu—O) and the like having no conductivity, electric connection between grains of the 2223 phase arranged in the filaments 10 is disadvantageously hindered.

Figure 4:
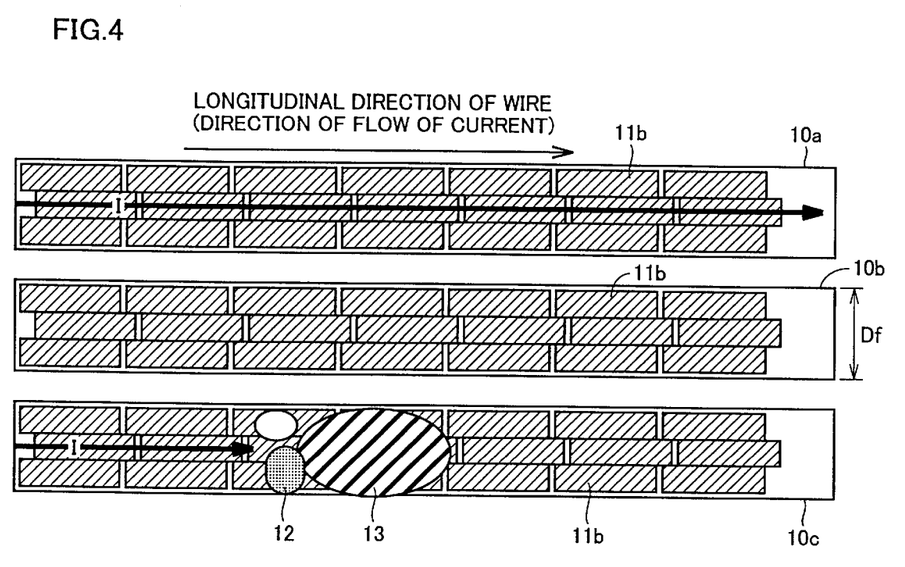
FIG. 4 schematically shows a longitudinal section of an oxide superconducting wire obtained by heat treating the wire shown in FIG. 3.

FIG. 4 schematically shows a longitudinal section of the oxide superconducting wire obtained by heat treating the wire 1 shown in FIG. 3. As shown in FIG. 4, the filaments 10a, 10b and 10c extend substantially in parallel with each other. Current I flows along the longitudinal direction of the wire 1, as shown by arrow. The filaments 10a and 10b are charged with grains 11b of the 2223 phase. In the filament 10c, on the other hand, the grain 13 of the $Ca_2PbO_4$ phase equivalent in size to the diameter Df of the filaments 10, for example, still remains as such after the heat treatment, to hinder electric connection between grains 11b of the 2223 phase. Consequently, the grain 13 of the $Ca_2PbO_4$ phase blocks the current I shown by arrow. Thus, the filament 10c is virtually absent in the wire, to reduce the number of effective superconducting wires contributing to electric conduction. While FIG. 4 shows the state where a single large grain remains, a plurality of filaments are insufficient in conductivity when a plurality of large grains remain.

When the outer diameter of the wire 1 is reduced and the number of the filaments is increased to about 500, the diameter Df of the filaments is reduced to about 10 $\mu$m. In this case, a phenomenon similar to the above may take place even if the maximum grain size of the raw material powder is about 10 $\mu$m.

Thus, it is understood important to select the grain sizes of the raw material powder charged into the metal tube not with reference to the mean grain size but with reference to the maximum grain size, in order to increase the critical current of the finally obtained wire. It is also understood that the maximum grain size must be selected to be smaller than the diameter of the filaments forming the prepared wire.

(Phenomenon 2)

As hereinabove described, an isotropic (round) wire obtained by reduction such as drawing is generally deformed into a tape-like shape by rolling. In this case, the aspect ratio (width/thickness) of the tape-like wire is set to about 20. The filaments forming the tape-like wire are also deformed into flat shapes having a similar aspect ratio due to the rolling.

Figure 5:
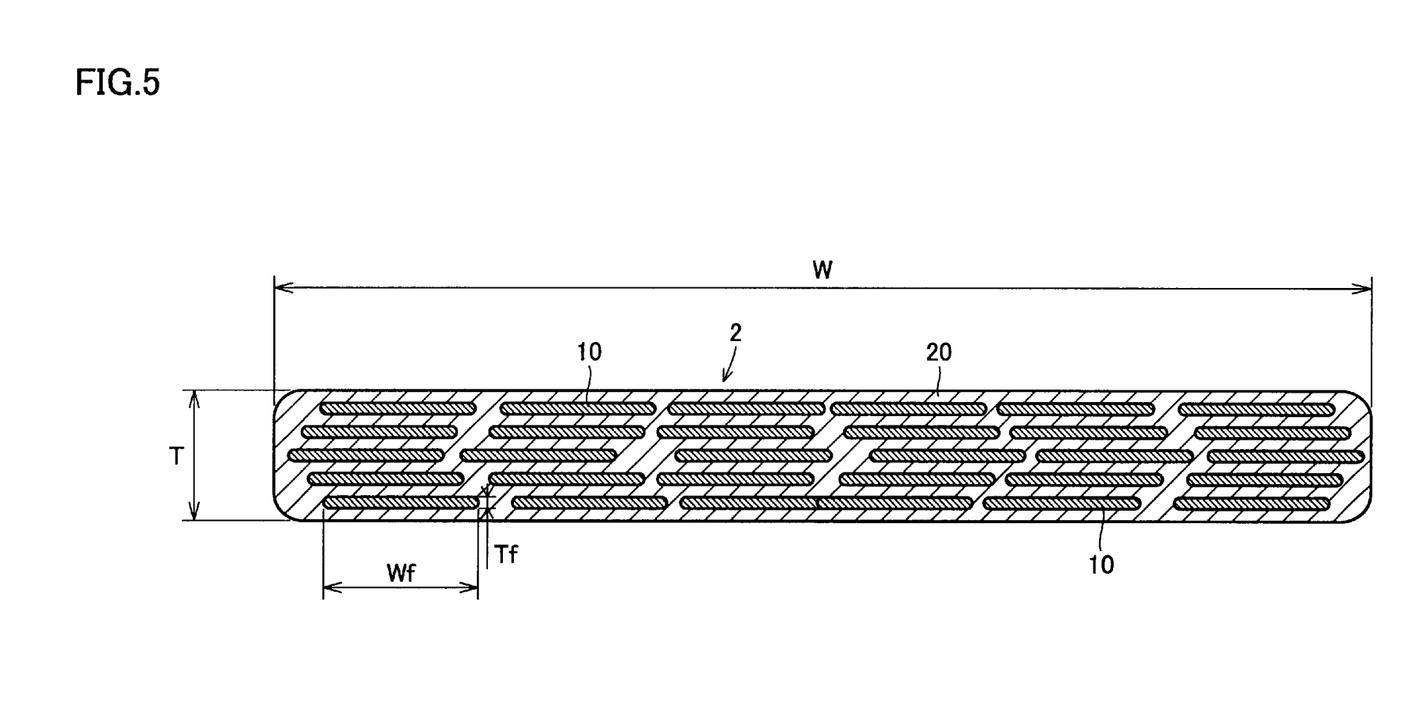
FIG. 5 is a schematic sectional view of a wire obtained by deforming the round wire shown in FIG. 2 into a tape-like shape by rolling.

FIG. 5 is a schematic sectional view of a wire 2 obtained by rolling the round wire 1 shown in FIG. 2, having the outer diameter D of about 1.0 mm and the filaments 10 of about 50 $\mu$m in diameter into a tape-like shape having an aspect ratio of 20 by rolling. As shown in FIG. 5, the tape-like wire 2 is formed a number of flat filaments 10 and the metal sheath 20 coating the filaments 10. The tape-like wire 2 has a width W of about 4 mm and a thickness T of about 0.2 mm. Each filament 10 has a width Wf of about 200 $\mu$m and a thickness Tf of about 10 $\mu$m.

When powder having a maximum grain size of at least 10 $\mu$m, e.g. about 20 $\mu$m, is employed for the tape-like wire 2 formed by the filaments 10 having the thickness Tf of about 10 $\mu$m shown in FIG. 5, the following phenomenon may tape place:

In the round wire 1, the maximum grain size (20 $\mu$m) is smaller than the filament diameter Df (50 $\mu$m) and hence maximum grains forming the powder do not occupy the areas of the filaments 10 in the stage of the intermediate product. When the thickness (minor diameter) of the filaments 10 is reduced due to the rolling performed on the round wire 1 such that the maximum grain size (20 $\mu$m) exceeds the filament diameter Df (10 $\mu$m) in the tape-like wire 2, however, the filaments 10 are partially clogged with crushed maximum particles. Such crushed grains come into contact with other types of grains only in small areas and are hardly transformed into the 2223 phase by reaction upon heat treatment, to readily remain as such. If the maximum grain size is smaller than the filament diameter Df in the tape-like wire 2, however, substantially all surfaces of the maximum grains come into contact with other types of grains to readily react with these grains by heat treatment, to be readily transformed into the 2223 phase.

Figure 6:
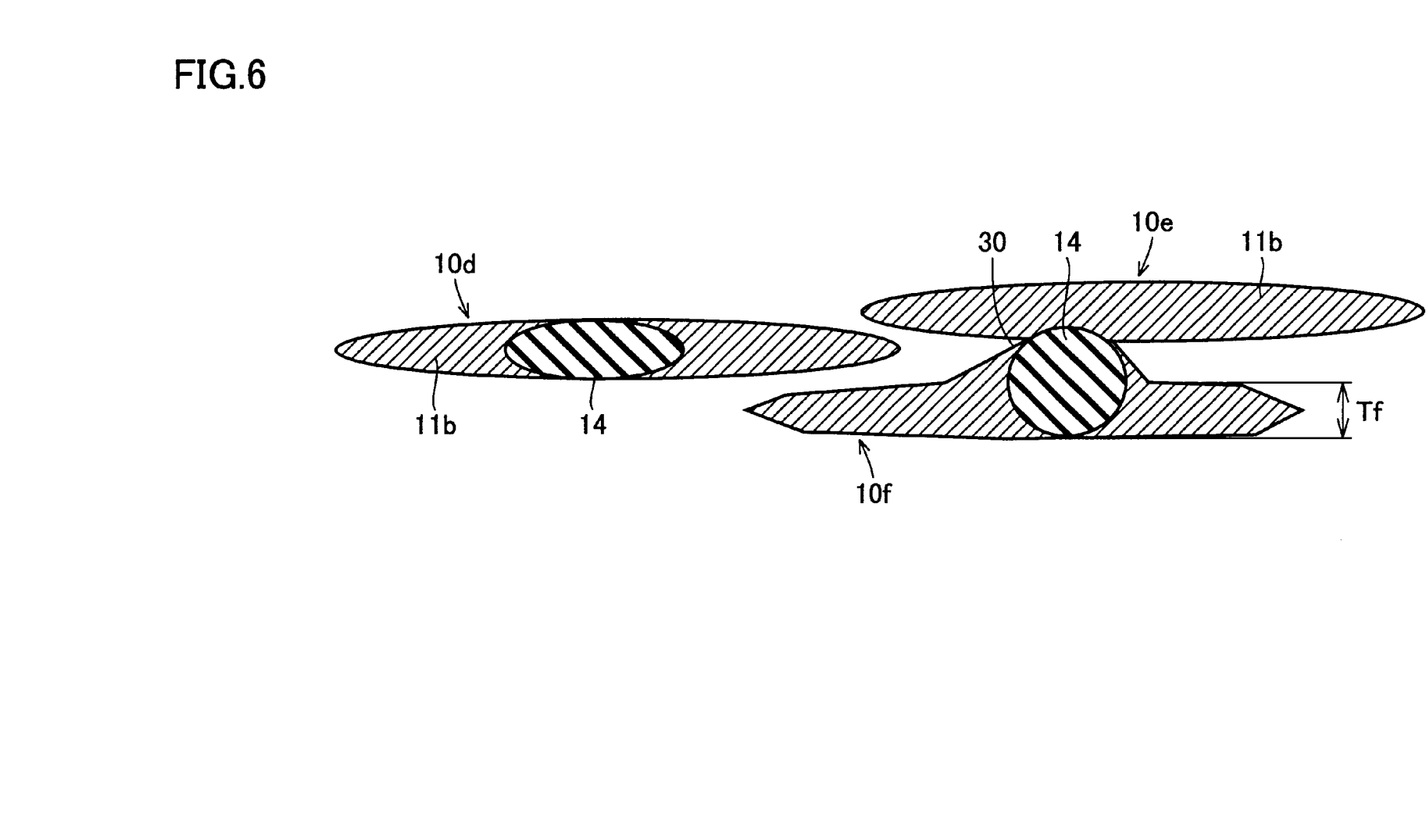
FIG. 6 is a partially fragmented sectional view schematically showing filaments included in an oxide superconducting wire obtained by heat treating the tape-like wire shown in FIG. 5.

FIG. 6 is a partially fragmented sectional view schematically showing filaments 10d, 10e and 10f in an oxide superconducting wire obtained by heat treating the tape-like wire 2 shown in FIG. 5. As shown in FIG. 6, 2223 phases 11b are formed in the filaments 10d, 10e and 10f due to the heat treatment. In the filament 10d, a grain 14 larger in diameter than the filament diameter Df remains unreacted in a state crushed by rolling. While the filament 10d is not entirely invalidated with reference to electric conduction by this state as compared with the phenomenon 1, the sectional area of the superconductor contributing to electric conduction is reduced as a result due to the presence of the unreacted grain.

As shown in FIG. 6, a ceramic grain 14 larger in size than the thickness Tf of the filament 10f is harder than the metal sheath consisting of silver or the like and breaks through the metal sheath during plastic working such as rolling. Consequently, the filament 10f is integrated with the adjacent filament 10e, to cause the so-called bridging 30. This reduces the degree of an effect contributing to improvement of the performance of the superconducting wire having a multi-filamentary structure intended in the stage of design.

From the aforementioned consideration on the phenomena 1 and 2, it is understood important to select the grain sizes of the raw material powder charged into the metal tube not with reference to the mean grain size but with reference to the maximum grain size in order to increase the critical current of the finally obtained wire. It is also understood that the maximum grain size must be selected to be smaller than the diameter of the filaments forming the prepared tape-like wire.

The effect of the present invention can be more remarkably attained in an oxide superconducting wire having extremely thin filaments.

EXAMPLE 1

Raw powder materials of carbonates or oxides of bismuth (Bi), lead (Pb), strontium (Sr), calcium (Ca) and copper (Cu) were mixed in blending ratios of 1.8:0.3:1.9:2.0:3.0. Heat treatment was repeated on the powder mixture at a temperature within the range of 700 to 860° C. a plurality of times, thereby preparing raw material powder for an oxide superconductor formed by a $(BiPb)_2Sr_2Ca_1Cu_2O_z$ superconducting phase (2212 phase) and a plurality of phases or substances such as $Ca_2PbO_4$, alkaline earth element-copper-oxide (Ca—Cu—O) and the like which are non-superconducting phases. This raw material powder was finally pulverized for preparing powder charged into a silver pipe employed as a metal tube. The pulverization time was varied for preparing five types of powder materials having different maximum grain sizes. Table 1 shows pulverization times (h) and maximum grain sizes ($\mu$m) of the five types of powder materials.

TABLE 1

| Powder Number | 1 | 2 | 3 | 4 | 5 |
|---|---|---|---|---|---|
| Pulverization Time (h) | 1 | 5 | 20 | 100 | 200 |
| Maximum Grain Size ($\mu$m) | 100 | 50 | 10 | 5 | 1 |

Five types of wires were prepared from the five types of powder materials by the following method:

In each sample, the powder was charged into a silver pipe, which in turn was reduced in diameter by drawing for preparing an elementary wire. This elementary wire was cut for preparing 61 elementary wires to be inserted into another silver pipe. The 61 elementary wires were inserted into this silver pipe for forming a base material of a multi-filamentary structure having 61 filaments. The multi-filamentary base material was drawn for preparing a round wire having an outer diameter of 1.1 mm. The minor diameter of each filament forming the round wire was about 50 $\mu$m.

Then, the round wire was rolled by uniaxial compression, for obtaining a tape-like wire 2 having the cross-sectional structure shown in FIG. 5 with a tape width W of 3.8 mm and a tape thickness T of 0.25 mm. The thickness (minor diameter) Tf of each filament 10 was about 10 $\mu$m. The tape-like wire 2 was heat treated in the atmosphere at a temperature of about 850° C. for 50 hours. Thereafter the tape-like wire 2 was rolled again thereby obtaining a tape-like wire 2 having a tape width W of 4.0 mm and a tape thickness T of 0.22 mm. At this time, the thickness (minor diameter) Tf of each filament 10 remained unchanged at about 10 $\mu$m. The tape-like wire 2 was heat treated in the atmosphere again at a temperature of 850° C. for 100 hours. Thus, five types of tape-like oxide superconducting wires were prepared.

Critical currents of the five types of tape-like oxide superconducting wires prepared in the aforementioned manner were measured at the liquid nitrogen temperature. Table 2 shows the results.

TABLE 2

| Wire Number | 1 | 2 | 3 | 4 | 5 |
|---|---|---|---|---|---|
| Number of Used Powder | 1 | 2 | 3 | 4 | 5 |
| Critical Current (A) | 5 | 10 | 50 | 70 | 72 |

As understood from Table 2, the critical currents of the wires Nos. 2 and 3 are remarkably different from each other. This is because the critical current depends on the relation between the minor diameter of the filaments and the maximum grain size of the powder in the isotropic wire as described above such that the wires Nos. 1 and 2 prepared from powder materials having maximum grain sizes larger than or substantially equivalent to the minor diameter (about 50 $\mu$m) of the filaments in the stage of round wires exhibited low critical currents while the wires Nos. 3 to 5 prepared from powder materials having maximum grain sizes smaller than the aforementioned minor diameter of the filaments exhibited high critical currents.

As understood from Table 2, the critical currents of the wires Nos. 3 and 4 are slightly different from each other. This is because the critical current depends on the relation between the minor diameter of the filaments and the maximum grain size of the powder in the tape-like wire as described above such that the wires Nos. 1 to 3 prepared from powder materials having maximum grain sizes larger than or substantially equivalent to the minor diameter (about 10 $\mu$m) of the filaments in the stage of tape-like wires exhibited low critical currents while the wires Nos. 4 and 5 prepared from powder materials having maximum grain sizes smaller than the aforementioned minor diameter of the filaments exhibited high critical currents.

EXAMPLE 2

Three types of wires having larger numbers of filaments were prepared from the three types of round wires having outer diameters of 1.1 mm prepared from the powder materials Nos. 3, 4 and 5 in Example 1 by the following method:

Each of the three types of round multi-filamentary wires (each having 61 filaments) was equally divided into seven round wires, which were inserted into another silver pipe having an outer diameter of 5 mm and an inner diameter of 3.5 mm for preparing a base material of a multi-filamentary structure having 427 filaments. This multi-filamentary base material was drawn for preparing a round wire having an outer diameter of 1.1 mm. The minor diameter of each filament forming the round wire was about 7 $\mu$m. The obtained three types of round wires were rolled and heat treated similarly to Example 1, for preparing three types of tape-like oxide superconducting wires having the same outer shapes as those in Example 1. In the tape-like wires, the mean thickness (minor diameter) of the filaments was about 3 $\mu$m.

The critical currents of the three types of tape-like superconducting wires prepared in the aforementioned manner were measured at the liquid nitrogen temperature. Table 3 shows the results.

TABLE 3

| Wire Number | 6 | 7 | 8 |
|---|---|---|---|
| Number of Used Powder | 3 | 4 | 5 |
| Critical Current (A) | 20 | 55 | 70 |

As understood from Table 3, the critical currents of the wires Nos. 6 and 7 are remarkably different from each other. This is because the critical current depends on the relation between the minor diameter of the filaments and the maximum grain size of the powder in the isotropic wire as described above such that the wire No. 6 prepared from powder having a maximum grain size larger than the minor diameter (about 7 $\mu$m) of the filaments in the stage of the round wire (427 filaments) exhibited a low critical current while the wires Nos. 7 and 8 prepared from powder materials having maximum grain sizes smaller than the aforementioned minor diameter of the filaments exhibited high critical currents.

As understood from Table 3, the critical currents of the wires Nos. 7 and 8 are slightly different from each other. This is because the critical current depends on the relation between the minor diameter of the filaments and the maximum grain size of the powder in the tape-like wire as described above such that the wires Nos. 6 and 7 prepared from powder materials having maximum grain sizes larger than the minor diameter (about 3 $\mu$m) of the filaments in the stage of tape-like wires exhibited low critical currents while the wire No. 8 prepared from powder having a maximum grain size smaller than the aforementioned minor diameter of the filaments exhibited a high critical current.

Comparing the wire No. 3 (Table 2) and the wire No. 6 (Table 3) prepared from powder materials of the same maximum grain size with each other, the wire No. 3 having 61 filaments exhibited a high critical current (50 A) while the wire No. 6 having 427 thin filaments exhibited a low critical current (20 A). Comparing the wire No. 4 (Table 2) and the wire No. 7 (Table 3) prepared from powder materials of the same maximum grain size with each other, the wire No. 4 having 61 filaments exhibited a considerably high critical current (70 A) while the wire No. 7 having 427 thin filaments exhibited a slightly low critical current (55 A). Thus, it is understood that the final tape-like wires prepared from powder materials of the same maximum grain size do not exhibit the same critical current if the minor diameters (or the thicknesses) of the filaments in the stage of intermediate products or final products are different form each other. In order to obtain an oxide superconducting wire having a high critical current, therefore, powder having a small maximum grain size must be employed with reference to each of the minor diameter (or the thickness) of the filaments forming the wire in the stage of the intermediate product and the minor diameter (or the thickness) of the filaments forming the wire in the stage of the final product.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an oxide superconducting wire comprising steps of:

preparing raw material powder for an oxide superconductor;

charging said raw material powder into a first metal tube;

reducing the diameter of said first metal tube charged with said raw material powder thereby obtaining an elementary wire;

charging a plurality of said elementary wires into a second metal tube;

reducing the diameter of said second metal tube charged with said elementary wires thereby obtaining a first wire, isotropically shaped in cross section, having a plurality of first filaments each containing said raw material powder and having a minor diameter;

performing uniaxial compression on said first wire thereby obtaining a tape-shaped second wire having a plurality of second filaments each containing said raw material powder; and performing heat treatment on said second wire thereby obtaining an oxide superconducting wire including a plurality of superconductor filaments, wherein the maximum grain size of said raw material powder is smaller than the minor diameter of said first filaments.

2. The method of preparing an oxide superconducting wire according to claim 1, wherein the maximum grain size of said raw material powder is smaller than the minor diameter of said second filaments.

3. The method of preparing an oxide superconducting wire according to claim 1, further comprising a step of performing uniaxial compression on said second wire subjected to said heat treatment and thereafter performing heat treatment.

4. The method of preparing an oxide superconducting wire according to claim 1, wherein said uniaxial compression is rolling.

5. The method of preparing an oxide superconducting wire according to claim 1, wherein said oxide superconductor is a bismuth-based oxide superconductor.

6. The method of preparing an oxide superconducting wire according to claim 5, wherein said bismuth-based oxide superconductor is a Bi—Pb—Sr—Ca—Cu—O based oxide superconductor.

7. The method of preparing an oxide superconducting wire according to claim 6, wherein said step of preparing said raw material powder for said oxide superconductor includes an operation of preparing raw material powder including a non-superconducting phase and a superconducting phase containing (Bi, Pb), Sr, Ca and Cu in composition ratios of about 2:2:1:2.

8. The method of preparing an oxide superconducting wire according to claim 7, wherein each said superconductor filament includes a superconducting phase containing (Bi, Pb), Sr, Ca and Cu in composition ratios of about 2:2:2:3.

9. The method of preparing an oxide superconducting wire according to claim 1, wherein each said metal tube consists of silver or a silver alloy.

10. A method of preparing an oxide superconducting wire comprising steps of:

preparing raw material powder for an oxide superconductor;

charging said raw material powder into a first metal tube;

reducing the diameter of said first metal tube charged with said raw material powder thereby obtaining an elementary wire;

charging a plurality of said elementary wires into a second metal tube;

reducing the diameter of said second metal tube charged with said elementary wires thereby obtaining a first wire, isotropically shaped in cross section, having a plurality of first filaments each containing said raw material powder and having a minor diameter;

charging a plurality of said first wires into a third metal tube;

reducing the diameter of said third metal wire charged with said first wires thereby obtaining a second wire, isotropically shaped in cross section, having a plurality of second filaments each containing said raw material powder;

performing uniaxial compression on said second wire thereby obtaining a tape-shaped third wire having a plurality of third filaments each containing said raw material powder; and performing heat treatment on said third wire thereby obtaining an oxide superconducting wire including a plurality of superconductor filaments, wherein the maximum grain size of said raw material powder is smaller than the minor diameter of said second filaments.

11. The method of preparing an oxide superconducting wire according to claim 10, wherein the maximum grain size of said raw material powder is smaller than the minor diameter of said third filaments.

12. The method of preparing an oxide superconducting wire according to claim 10, further comprising a step of performing uniaxial compression on said third wire subjected to said heat treatment and thereafter performing heat treatment.

13. The method of preparing an oxide superconducting wire according to claim 10, wherein said uniaxial compression is rolling.

14. The method of preparing an oxide superconducting wire according to claim 10, wherein said oxide superconductor is a bismuth-based oxide superconductor.

15. The method of preparing an oxide superconducting wire according to claim 14, wherein said bismuth-based oxide superconductor is a Bi—Pb—Sr—Ca—Cu—O based oxide superconductor.

16. The method of preparing an oxide superconducting wire according to claim 15, wherein said step of preparing said raw material powder for said oxide superconductor includes an operation of preparing raw material powder including a non-superconducting phase and a superconducting phase containing (Bi, Pb), Sr, Ca and Cu in composition ratios of about 2:2:1:2.

17. The method of preparing an oxide superconducting wire according to claim 16, wherein each said superconductor filament includes a superconducting phase containing (Bi, Pb), Sr, Ca and Cu in composition ratios of about 2:2:2:3.

18. The method of preparing an oxide superconducting wire according to claim 10, wherein each said metal tube consists of silver or a silver alloy.

19. A method of preparing an oxide superconducting wire comprising steps of:

preparing raw material powder for an oxide superconductor;

charging said raw material powder into a first metal tube;

reducing the diameter of said first metal tube charged with said raw material powder thereby obtaining an elementary wire;

charging a plurality of said elementary wires into a second metal tube;

performing plastic working on said second metal tube charged with said elementary wires thereby obtaining a tape-shaped wire having a plurality of raw material filaments each containing said raw material powder and having a minor diameter; and heat treating said tape-like wire thereby obtaining an oxide superconducting wire including a plurality of superconductor filaments, wherein the maximum grain size of said raw material powder is smaller than the minor diameter of said raw material filaments.

20. The method of preparing an oxide superconducting wire according to claim 19, wherein said oxide superconductor is a bismuth-based oxide superconductor.

21. The method of preparing an oxide superconducting wire according to claim 20, wherein said bismuth-based oxide superconductor is a Bi—Pb—Sr—Ca—Cu—O based oxide superconductor.

22. The method of preparing an oxide superconducting wire according to claim 21, wherein said step of preparing said raw material powder for said oxide superconductor includes an operation of preparing raw material powder including a non-superconducting phase and a superconducting phase containing (Bi, Pb), Sr, Ca and Cu in composition ratios of about 2:2:1:2.

23. The method of preparing an oxide superconducting wire according to claim 22, wherein each said superconductor filament includes a superconducting phase containing (Bi, Pb), Sr, Ca and Cu in composition ratios of about 2:2:2:3.

24. The method of preparing an oxide superconducting wire according to claim 19, wherein each said metal tube consists of silver or a silver alloy.

* * * * *